(12) United States Patent
Ferguson (10) Patent No.: US 8,373,451 B1
(45) Date of Patent: Feb. 12, 2013

(54) DIGITAL DRIVER WITH RC TUNED TRANSITION CONTROL

(75) Inventor: Paul C. Ferguson, Riverton, UT (US)

(73) Assignee: Adtran, Inc., Huntsville, AL (US)

( * ) Notice: Subject to any disclaimer, the term of this patent is extended or adjusted under 35 U.S.C. 154(b) by 110 days.

(21) Appl. No.: 12/976,118

(22) Filed: Dec. 22, 2010

(51) Int. Cl.
*H03B 1/00* (2006.01)
*H03K 3/00* (2006.01)

(52) U.S. Cl. .................. 327/108; 327/111; 327/112

(58) Field of Classification Search .................. 327/108, 327/111, 112
See application file for complete search history.

(56) References Cited

U.S. PATENT DOCUMENTS

| 5,218,239 | A * | 6/1993 | Boomer ........................... 326/27 |
| 2009/0066394 | A1 * | 3/2009 | Kanda et al. ................... 327/308 |

* cited by examiner

*Primary Examiner* — John Poos
(74) *Attorney, Agent, or Firm* — Blakely Sokoloff Taylor & Zafman, LLP (57) ABSTRACT

Improved digital driver with transition time control of an output stage output transistor of the digital driver. A predriver circuit has a resistor that forms an RC time constant with a feedback capacitor of the output transistor. The RC time constant is adjusted to control corner resolution of the output transistor in output switching. The RC time constant can be controlled by a digitally-controlled variable capacitor. Additionally, a delay may be introduced in the turning on of the output transistor as compared with the turn off time to reduce simultaneous conduction or shoot-through current.

20 Claims, 5 Drawing Sheets

DIGITAL DRIVER WITH RC TUNED TRANSITION CONTROL

FIELD

Embodiments of the invention relate to digital drivers, and more particularly to controlling rising and falling edge responses in a digital driver by tuning an RC time constant.

BACKGROUND

It is common in a digital circuit to have microchips connected via digital interfaces. The digital interfaces have digital drivers that can introduce noise in the circuit. For example, fast transitions or signal edges on a signal transmitted between two microchips over a printed circuit board (PCB) trace connecting the microchips cause crosstalk or electromagnetic interference.

Most traditional digital drivers are similar or have the same layout as a. CMOS (complimentary metal-oxide-semiconductor) inverter circuit. A large PMOS (positively-doped metal-oxide-semiconductor, or p-type) transistor pulls up the line voltage during a rising edge, and a large NMOS (negatively-doped metal-oxide-semiconductor, or n-type) transistor pulls down the line voltage during a falling edge. The advantages to such a digital driver is that it is simple, small (very efficient in use of die area), and can handle fast switching speeds. However, there are several disadvantages to the inverter design. Although the traditional digital driver, based on inverter circuit design is generally fast, the edge speed is very sensitive to variations in temperature, power supply voltage, and manufacturing parameters. Transition times may exhibit a four-to-one or even five-to-one variation from one digital line driver to the next and in a digital driver under different operating conditions. Thus, the inverter design often has undesirable performance because of timing uncertainty, potentially very high di/di and large peak currents.

Figure 1:
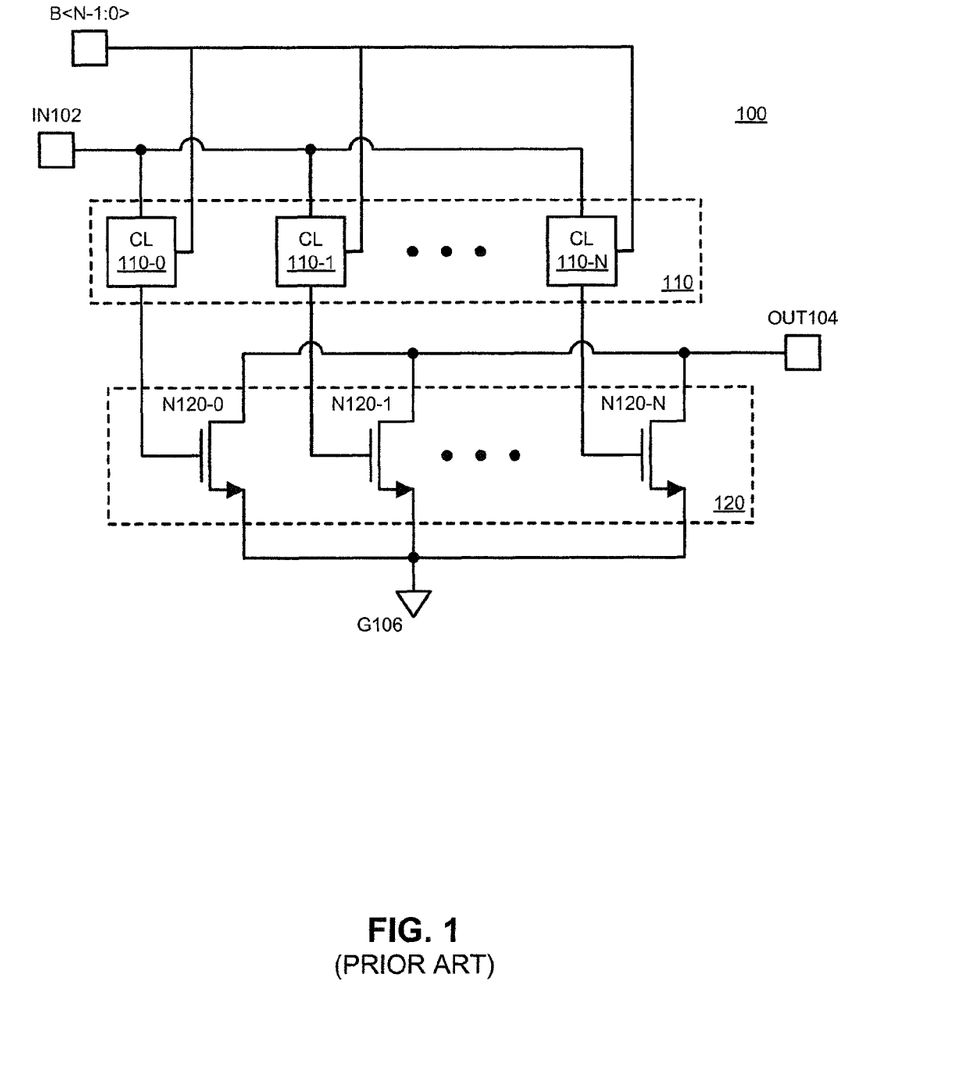
FIG. 1 is a traditional digital driver.

Traditional digital drivers are designed to match impedance of the driver circuit to the output line. FIG. 1 shows a traditional digital driver that uses the impedance-matching technique. The traditional digital driver 100 of FIG. 1 has an NMOS leg including an array of output transistors 120 referenced to G106, and an output signal line our 104 with an output signal generated in response to an input signal on input line IN102. As mentioned above, generally a large output transistor is used; in this case, the output transistor is multiple transistors to achieve more precise control of the output current. It will be understood that traditional digital driver 100 illustrates the basics of any traditional digital driver although many additional details related to control of the output slew rate or transition control may be added.

IN102 is the input signal line for the output transistor array 120. As illustrated, each individual output transistor (N120-0, N120-1, ..., N120-N) of transistor array 120 is controlled by corresponding gate control logic 110 (CL110-0, CL110-1, ..., CL110-N). Control logic 110 can be implemented in a variety of ways, as would be understood by those skilled in the art. Control signal B<N–1:0> controls which control logic elements 110 will turn on respective output transistors N120-0, ..., N120-n to generate an output signal on output line OUT 104. The output current of the output signal is controlled by how many output transistors of the array are turned on. Thus as circumstances change the output can be changed to better match the impedance of the output line, which reduces output signal reflections.

Although impedance matching may be achieved with the traditional digital driver 100, the digital driver still has a poor response with respect to crosstalk and ground bounce. Additionally, it would be understood that the traditional digital driver 100 requires a significant number of components (resulting in processing expense), a large amount of integrated circuit (I/C) real-estate, and power consumption requirements that include wide ranges of current from the power supply. As the push toward higher-speed circuits increases, the exposure to crosstalk and interference problems increases because shorter transition times result in greater crosstalk and interference. As mentioned above, the traditional digital driver 100 is susceptible to the effects of the shorter transition times, even if signal reflection is reduced.

In addition to the crosstalk and interference problems, fast transitions require more transient current from the power supply. The transient current used by a digital driver circuit can be a significant factor in the performance of the interfacing microchips. Because the inductance of the power supply bond wires and leads combines with the inherent on-chip supply capacitance to create a resonant circuit undesirable high-frequency signals may be produced. If there is a fast rise time in transient supply current, or a sharp transient current the resonant circuit may be excited causing ringing on the supply voltages.

Thus, there are significant performance disadvantages to the traditional digital driver 100 based on the inverter design. The disadvantages discussed above result in power inefficiency and noise in the microchip. The disadvantages are increasingly significant in higher-speed microchips.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Figure 2:
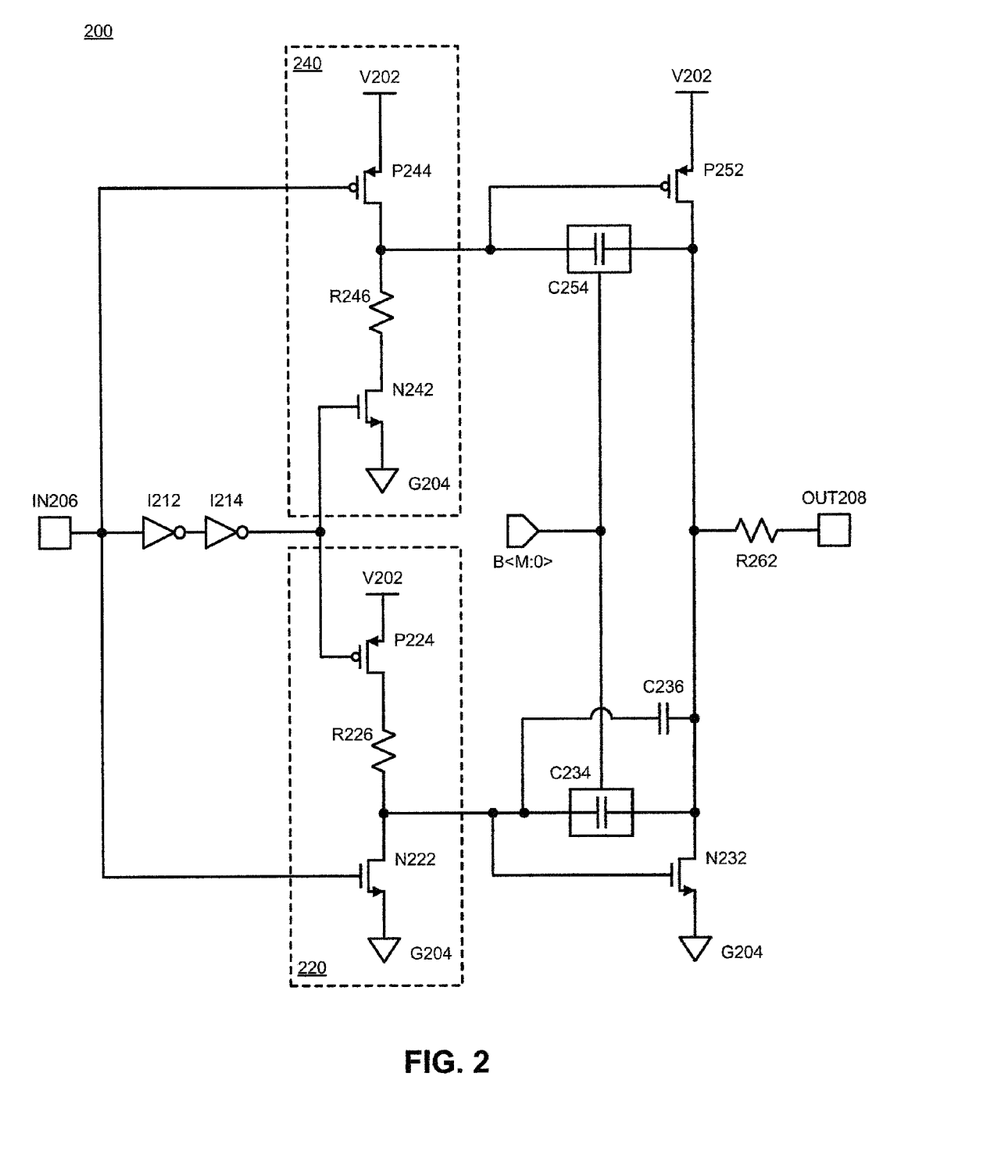
FIG. 2 is an embodiment of a digital driver in accordance with the present disclosure.

For the disclosure transition times of output signal of an output transistor N232 of digital driver 200 are controlled with an RC time constant. A predriver coupled to the control terminal of the output transistor determines state of the output transistor. The output transistor has feedback capacitor (C236) between its output node to its control node. The feedback capacitor includes selectable values determined by a digital control value. The predriver circuit includes a pull-up resistor, R226, coupled to a pull-up transistor P224. The pull-up resistor and feedback capacitor form an RC time constant that determines the rise time of the output signal of the output transistor. The RC time constant is adjusted with the variable capacitance to control corner resolution of the output signal. In one embodiment a delay is introduced (I212, I214) in turning on the output transistor as compared with the turn off time to reduce simultaneous conduction or shoot-through current.

Manipulation or adjustment of the RC time constant is defined as RC tuning. The use of RC tuning enables a clean and controlled transition over all corners of operation of the digital driver circuit 200. Testing indicates that the 5:1 transition time variations of a traditional digital line driver are reduced to 2:1 for the digital driver of FIG. 2. In addition overshoot and ringing can be virtually eliminated.

When the digital driver circuit is manufactured, it can receive input specific to the chip to indicate a value or values for its variable capacitor element(s). In one embodiment, an I/C including the digital driver uses a tuning loop to trim bandwidth of analog filters used in other parts of the chip to reduce the effects of process variation. The tuning loop for the bandwidth of the filters can be used to trim the digital driver.

There are many chips that employ both analog as well as digital design components. For example, mixed-signal integrated circuits use analog filters and have digital outputs. While not specifically limited to such implementations, the use of RC tuning as described herein is especially desirable on such integrated circuits. For example, high fidelity analog chips such as an audio playback chip already have tuned filters, and are generally designed to account for ground bounce and noise. Thus, RC tuning is a valuable addition with little overhead cost to implement that takes advantage of the existing tuning filter components, while providing good digital output control that reduces ground bounce and noise. In some chip implementations, there are already components in place for a tuning loop (see FIG. 4 below for more detail), which allows tuning of digital output drivers with minimal additional chip components.

As mentioned above the RC time constant is adjusted to affect the digital driver 200 performance, the digital driver circuit may be accompanied by an RC relaxation oscillator whose frequency can be adjusted by adjusting the value of the variable capacitor. In other embodiments other types of oscillators are used. The tuning loop adjusts the frequency of the oscillator by digitally selecting values of the variable capacitor until it closely matches a reference frequency. As used herein "matching" the reference frequency is understood to refer to matching the frequency within a set tolerance for the system, taking into effect the noise and other performance issues tolerable for a given design. A digital number that selects the desired capacitance value can then be stored in memory in the digital driver or in the I/C associated with the digital driver.

In one embodiment, the variable capacitor is a CAPDAC, an array of capacitive elements that can be selectively switched into the circuit. Thus, a CAPDAC allows for digital control of capacitance by switching in one or more capacitor elements to achieve a desired capacitance. The elements of the CAPDAC are not necessarily of uniform size, as will be understood by those skilled in the art. When a CAPDAC is used the value for the variable capacitor may refer to a stored binary value for use with the digital driver 200.

FIG. 2 is an embodiment digital driver 200 with output RC time constant control. In contrast to the traditional approach of controlling the output current by impedance matching, an RC time constant controls the rise and fall time of the output signal. Digital driver 200 is an example of a complementary digital driver, where output transistor N232 pulls down the voltage on the output line (OUT208), and output transistor P252 pulls up the voltage on output line. In one embodiment, N232 and P252 are "large" relative to other transistors in a circuit. The relatively large transistor N232 and P252 have sufficient capacity to drive the output and achieve desired switching speeds.

As shown in FIG. 2, output transistor N232 has a reference node (the source node of the transistor) coupled to low-voltage reference G204 (which is generally a circuit or analog ground), and an output node (a drain) coupled to output line OUT208 through output resistor R262. The control node (a gate) is driven by predriver circuit 220. Feedback capacitance is provided between the output node and the control node of output transistor N232. Capacitor 234 is a digitally-controlled variable capacitor. In other embodiments other types of transistors may be used, such as, for example BJTs. In an implementation with a BJT, the reference node, output node, and control node would be, respectively the emitter, collector, and base of the transistor, as is understood by those of skill in the art.

Similarly, as shown in FIG. 2, output transistor P252 includes a reference node (a source) coupled to high-voltage reference V202 (which is generally the voltage source for system 200), and an output node (a drain) coupled to output line OUT208 through output resistor R262. The control node (a gate) is driven by predriver circuit 240. Feedback capacitance is provided between the output node and the control node of output transistor P252. Capacitor 254 represents a digitally-controlled variable capacitor. In other embodiments other types of transistors may be used.

Figure 3:
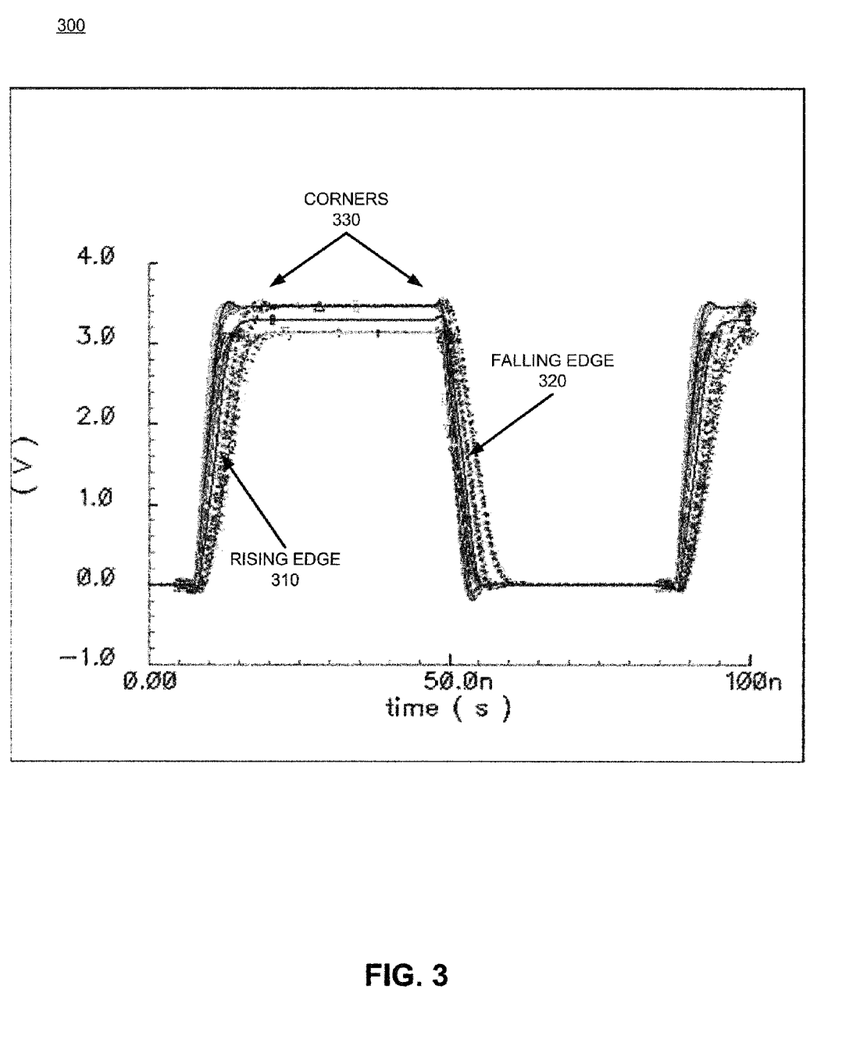
FIG. 3 is a simulation showing the performance of the circuit of FIG. 2

It will be understood that capacitor C234 associated with output transistor N232 could be controlled separately from capacitor C254, rather than controlled by the same control bits B<M:0> as shown. M can be any integer. The simulation of FIG. 3 showing the performance of digital driver 200 performance has an M=2 (three bits of resolution). More bits of resolution allow for finer control of the corners at the expense of more bits, more control logic, and a more complex variable capacitor design. In an embodiment where the same control bits are used for both C234 and C254, additional feedback capacitor C236 can be added to N232.

It is common for n-type devices to operate slightly faster than corresponding or complementary p-type devices created with common chip processing. The value of C236 could be selected to achieve a closer match in rising and falling edge transition times. The value of C236 should be chosen to be smaller than the value of C234, to allow the primary capacitive and RC time constant effects to be controlled by the value of C234. The value of C236 may not necessarily need to be chosen to be substantially smaller compared to C234, given that it may be desired to have some effect on the circuit, but would be chosen smaller than C234 to match the overall switching speed of N232 closer to that of P252.

As used herein, a capacitor or resistor is large relative to another, or one is substantially larger compared to another, when its value has a predominate effect on the circuit. A general rule of thumb is when the larger component has a value, for example, 5 times greater or more (e.g., 10×). By extension, a capacitor or resistor is small relative to another if it is 5 times smaller or more.

It will be understood that feedback capacitors C234 (with optional component C236) and C254 produce a Miller effect for digital driver 200. The Miller effect refers to the fact that a feedback capacitor from an output to an input of an amplifier will be seen at the input as having its value multiplied by the gain of the amplifier. Thus, for a value C, the feedback capacitor would be seen from the input as having a value A*C, where A is the numeric factor representing the gain of the amplifier. It will be understood that the value is actually 1+A*C, which is effectively A*C for values of (A*C)>>1, which is expected to be the case in most implementations. When a circuit, such as predrivers 220 and 240, drives an output transistor, the circuit will also drive current to the feedback capacitor. However, on the output side of the capacitor, the charge potential will be A times as high, and so the circuit driving the amplifier will see A times the capacitive effect in the feedback capacitor as electrical equilibrium is brought to the circuit by building up charge on the input side of the feedback capacitor. The amount of current needed to drive to the feedback capacitor to drive the charge potential up on the input side is much higher, which appears to increase the value of the capacitor as seen by the predriver.

As mentioned above, predriver 220 drives the control node of output transistor N232. Because it drives the control node of the output transistor, it can be said to control the state of the output transistor. Controlling the state refers to controlling when output transistor N232 switches from being "on" to being "off," or when it conducts current and when it does not. In one embodiment, controlling the state may be referred to as "thresholding", meaning the on and off voltage thresholds of the transistor are controlled to cause the transistor to transition state. Each transistor has an inherent voltage threshold above which it will turn on, and below which it will turn off. Predriver 220 drive the control node above and below that threshold based on the input signal and the control logic of the predriver.

A simplified representation of predriver 220 includes complementary transistors N222 and P224 to pull down and pull up, respectively, the control node of output transistor N232. It will be understood that N222 and P224 are driven in response to the input signal on input line IN206. N-type transistor N222 has a control node directly driven by input line IN206, a reference node coupled to G204, and an output node coupled to the control node of output transistor IN232. When the input signal goes high, N222 turns on, pulling down the control node of N232 to turn the n-type output transistor off. Output transistor N232 will shut off essentially immediately when IN206 goes high. When the input signal goes low, N222 shuts off, and P224 drives the control node of N232.

P-type transistor P224 has a control node driven through delay inverters in response to the input signal on input line IN206, a reference node coupled to V202, and an output line coupled through resistor R226 to the control node of output transistor N232. When the input signal goes high, P224 shuts off, and the control node of N232 is driven by N222 as discussed above. When IN206 goes low, P224 turns on, and pulls the control node of N232 high, turning on the output transistor. It will be observed that rather than being directly driven by IN206, transistor P224 is driven through two inverters, I212 and I214, which introduces a delay in turning on P224 with respect to the input signal. In contrast, N222 switches immediately in response to IN206 without inverter delay. Thus, output transistor N232 will be shut off essentially immediately in response to IN206, but will be turned on after a delay. A similar effect is provided with predriver 240 for output transistor P252. Thus, shoot through current on a signal switch (an edge or transition) is limited because one output transistor will turn off before the complementary output transistor turns on.

It will also be observed that P224 includes pull-up resistor R226 coupled to its output node, introducing an output resistance to predriver 220. P-type transistor P224 controls the turning on of output transistor N232. Thus, R226 provides a resistance when N232 is turned on. It will be understood that R226 and C234 (and optionally C236) together have an RC time constant that affects the switching of N232. Thus, based on the values of R226 and C234, the fall time of the output switching can be controlled (because IN232 will pull down OUT208, with the RC time constant affecting how fast the pull-down occurs).

It will be understood that all transistors have an intrinsic or inherent resistance. Thus, to control the RC time constant to a more precise value, the value of R226 should be selected to be large relative to the characteristic resistance of P224. Thus, the value of R226 will be more significant or more dominant in the RC time constant, and the intrinsic resistance of P224 can be effectively ignored.

It will be understood that predriver 220 can be implemented simply as presented in digital driver 200, or could be made more complex, but having the same basic logical operation of predriver 220 as shown. Thus, more circuit elements could be added to provide additional functionality. However, the basic circuit design illustrated provides the basic circuit operation, and additional elements and additional functionality would not alter the basic operation shown and described. Additional circuit elements could be added (e.g., parallel elements) to provide a specific implementation, such as using multiple, smaller parallel transistors instead of a large transistor, as is understood by those skilled in the art.

Predriver 240 operates similarly for output transistor P252 as predriver 220 does for output transistor N232. Predriver 240 includes complementary transistors N242 and P244 to pull down and pull up, respectively, the control node of output transistor P252, based on or in response to the input signal on input line IN206. N-type transistor N242 has a control node driven by IN206 through inverters I212 and I214 to delay turn on of P252 with respect to the turn off of N232, a reference node coupled to G204, and an output node coupled through resistor 246 to the control node of output transistor P252. When the input signal goes high, N242 turns on after a delay, pulling down the control node of P252 to turn the p-type output transistor on.

P-type transistor P244 has a control node driven directly by the input signal on input line IN206, a reference node coupled to V202, and an output line coupled to the control node of output transistor P252. When IN206 goes low, P244 turns on, and pulls the control node of P252 high, turning off the output transistor.

Similar to what is discussed above with respect to predriver 220, the output resistance of predriver 240 as seen by output transistor P252 is the value of R246 (assuming it is selected with a value significantly larger than the intrinsic resistance of N242). Thus, R246 and C254 form an RC time constant that affects the switching of P252. Thus, based on the values of R246 and C254, the rise time of the output switching can be controlled.

As discussed above, a traditional approach to digital driver output control is to control the impedance matching with the output line. With imperfect impedance matching, there is a possibility of reflections from the output signal. System 200 controls the rise and fall time of the output switching. If the rise time is controlled to be slow enough, the possibility of reflections reduces dramatically, which may obviate the need for impedance matching. Thus, as long as the transition time is slower than the reflection, even if reflections exist in the system, they will not have a noticeable impact on system performance.

However, given system tolerance, it may not be possible to slow the transition times sufficient to avoid problems with reflections. Additionally, the capacitive feedback reduces the output impedance of the output at high frequencies. Thus, in one embodiment, digital driver 200 includes output resistor R262 to improve impedance matching and reduce the effects of reflections. Rather than matching impedance to the output line, resistance can be introduced into the output line to reduce the effects of reflections.

While reference has been made to the example of digital driver 200, a general summary without specific reference to the drawings follows. A digital driver design enables its transition times to be controlled by an RC product. A variable capacitor (e.g. a small CAPDAC) in feedback around a large n-type output transistor, and another variable capacitor in feedback around a complementary large p-type output transistor combine with resistors in predriver stages.

The Miller effect multiplies the value of the feedback capacitors so that they present a significant load to the predriver stages (one stage drives the p-type output transistor device and another stage drives the p-type output transistor device). In one embodiment, each predriver stage uses a large predriver output transistor with low output impedance, and follows it with a resistor to cause the overall output impedance of the predriver stage to be predominantly based on the resistor. Thus, an RC time constant is created at the control node of each output transistor of the digital driver output stage. The time constant can be controlled by a tuning loop that determines the value of the variable capacitor that should be used for the particular digital driver circuit. In one embodiment, the design provides rise and fall time control without requiring a bias current, and having zero standby current.

An inverter delay can be introduced to avoid simultaneous conduction of the complementary output transistors. Thus, turn on can be delayed by, for example, a two-inverter delay (I1212 and I1214 in FIG. 2), while turn off can occur without delay. Variations on the delay can be provided as long as the turn on occurs some delay after the turn off.

The time constant of the feedback capacitor and the predriver resistor can control the timing of the entire digital driver output. The speed control provided by the RC time constant can guarantee output bandwidth. The value of the RC time constant can be slightly different for each individual circuit to account for process variation in the making or manufacture of the circuit.

It will be understood that white MOS transistors are common for use in digital drivers, other types of transistors could be used. Any n-type and p-type complementary transistor design could be used as described herein. Thus, field effect transistors (FETs) could be used such as MOSFETs or JFETs (junction field effect transistors). Additionally, the transistors could be bipolar junction transistors (BJTs), or another type of transistor. It will be appreciated that a BJT has a base current that should be accounted for in design, whereas gate current on a MOSFET is negligible. One possible design consideration may be to vary the resistor size in the bases of the transistors in a BJT delay line to adjust for the base current. Other modifications may be understood by those skilled in the art.

As already mentioned above, for simplicity in terminology transistors are described as having a control terminal, an output terminal, and a reference terminal. The control terminal refers to the terminal with which the transistor is activated, such as a FET gate or a BJT base. The output terminal refers specifically to the terminal on which the output is generally driven, such as the FET drain or the BJT collector. The reference terminal refers to the source of the charge carriers, such as the FET source or a BJT emitter.

FIG. 3 shows waveforms 300 of a simulation that demonstrate the performance of digital driver 200 with output RC time constant control. The waveforms 300 illustrate an overlap of various digital driver output switching responses simulated for variations in circuit conditions and process variation. As illustrated, despite having a variety of conditions for each separate output circuit, each response curve illustrates a fairly consistent switching response.

Rising edge 310 illustrates the various rising edges. As discussed above, traditional circuits may have a variation of 5:1 on the rise time, whereas it will be observed that representation 300 illustrates a variation of only about 2:1. A similar effect is seen with reference to falling edge 320, which illustrates the various falling edges. Again, rather than looking at the details of individual curves, it can be seen generally through the observation of the falling edges that the simulation shows a variation of only about 2:1 in fall times.

The conditions of the simulation are provided in more detail below, but in general illustrate responses for circuits designed in accordance with digital driver 200 of FIG. 2. Thus, the digital drivers simulated in representation 300 each have a feedback capacitor on the output transistors forming an RC time constant with a predriver resistor. The RC time constant is tuned for the particular digital driver to control corner resolution of the output transistor in digital output switching. Corners 330 illustrate a smooth transition response.

It will be understood that most integrated circuits include multiple digital drivers. As a practical matter, all digital driver circuits on a particular integrated circuit can be considered to have essentially the same process variations and experience similar operating conditions. Thus, rather than controlling each digital driver individually, all drivers on a particular chip may be considered to match sufficiently closely on the chip to have a single variable capacitor value to control separate variable feedback capacitors on each of the digital drivers. In one embodiment, a single variable capacitor value (e.g., CAPDAC value) is stored on an integrated circuit, and used for all digital drivers on the I/C.

The simulations were performed with an accurate 3.3 V supply and at room temperature, which are expected conditions for a production test. The simulation test bench includes 1 pF of parasitic capacitance at the digital driver output, a four inch trace model for the output line, and 5 pF load at the far end of the trace. The trace model is lossless with L=12.5 nH/in and C=5 pF/in.

Simulations suggest that 3 bits of resolution in the variable capacitor value are sufficient to produce the desired control of the transition time for a given application in a digital communication circuit. More bits of resolution may be used where more precise digital control over the RC time constant is needed, as will be understood by those skilled in the art.

Figure 4:
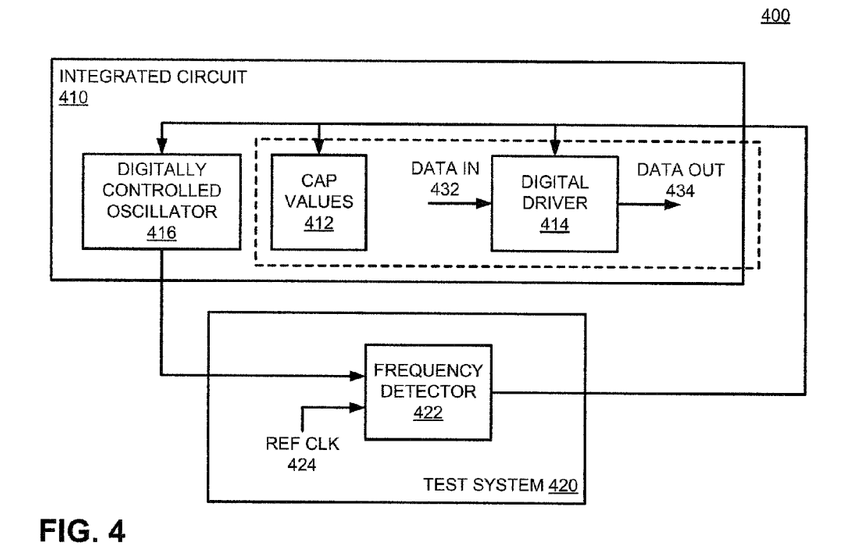
FIG. 4 is a representation of a tuning system to select a capacitor value for setting an output RC time constant of a digital driver.

FIG. 4 is a representation of a tuning system 400 to set a variable capacitor value to adjust an output RC time constant of a digital driver. System 400 illustrates a simplified example of a setup to determine the variable capacitor value to tune the RC time constant. As discussed above, the output of a digitally controlled oscillator is compared to a reference frequency. The CAPDAC input is adjusted until the output frequency of the oscillator is sufficiently close to the reference frequency. Thus, a tuning loop is created. The loop may be implemented in post-production testing (i.e., after the circuit is manufactured) to determine where to set its variable capacitor to achieve desired rise and fall time performance. Alternately, the loop may be implemented on the chip itself, and can be operated at any time the user wishes to activate it.

Integrated circuit 410 represents any whole or part of an I/C into which a digital driver may be designed. Digital driver 414 represents a digital driver in accordance with any embodiment described herein, with a feedback capacitor on the output stage output transistors, and resistors on the predriver stages or predrivers that drive the output transistors. The resistor and capacitor form an RC time constant. Output signal data out 434 is generated from input signal data in 432 during operation of I/C 410.

Test device 420 connects to I/C 410, and performs one or more tests on the circuits, including providing a trim value determination test to determine what value of the variable capacitor should be used in digital driver 414. A tuning loop is formed with digitally controlled oscillator 416 of I/C 410, which is controlled by the same values used to control the RC time constant of digital driver 414. When the tuning loop runs, it detects the native resonant frequency of an RC relaxation circuit in digitally controlled oscillator 416, which is formed by using equivalent resistor and capacitor elements in the oscillator as used for the predriver resistor and the feedback capacitor of digital driver 414.

it will be understood from tuning system 400 that the elements inside the dashed lines (cap values 412 and digital driver 414) are not part of the tuning loop. The digital driver is a stave to the tuning loop, because it is controlled by the capacitor values determined by the tuning loop. Oscillator 416 is manufactured on the same process and operates at the same temperature as digital driver 414, and thus the speed and behavior of the digital driver is matched by the oscillator when the oscillator uses the same R and C values.

The output of oscillator 416 is fed into frequency detector 422 of test system 420, and compared against a reference clock (ref clk) 424. Variations of the resonant frequency can be caused by process variations in the production of I/C 410. The resonant frequency may fall outside a desired value range for the desired performance of digital driver 414. Thus, an adjustment value is generated by frequency detector 422 to bring the RC time constant of I/C 410 within the desired specifications.

In tuning system 400, the adjustment values are provided to oscillator 416 and digital driver 414, and saved as capacitor values 412. Capacitor values 412 will be used as the basis for generating a digital control signal (e.g., B<M:0> of FIG. 2) to control the value of the feedback capacitors during operation of I/C 410. In one embodiment, the values are stored in a fuse ROM (read only memory), and the value is written in the transmitter and receiver. The values could be stored in storage blocks directly in digital driver 414 (e.g., writing fuses or registers to hardwire the feedback capacitor to its desired value), or could be stored in a memory device that then generates the control signal.

Figure 5:
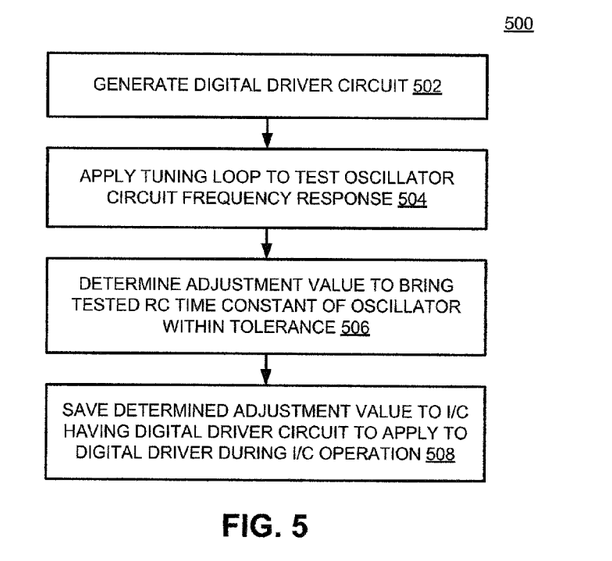
FIG. 5 is a flow diagram of a method embodiment for setting a variable capacitor value to adjust an output RC time constant of a digital driver.

FIG. 5 shows a flow diagram 500 of an embodiment of a process for setting a variable capacitor value to adjust an output RC time constant of a digital driver. Flow diagrams as illustrated herein provide examples of sequences of various process actions. Although shown in a particular sequence or order, unless otherwise specified, the order of the actions can be modified. Thus, the illustrated implementations should be understood only as an example, and the process can be performed in a different order, and some actions may be performed in parallel. Additionally, one or more actions can be omitted in various embodiments of the invention; thus, not all actions are required in every implementation. Other process flows are possible.

Flow diagram 500 includes operations to produce a desired RC time constant for controlling corner resolution of a digital driver output. A production system generates a digital driver circuit, 502. The digital driver circuit is generated with an output transistor controlled by a predriver. The predriver includes an output resistor provides the resistance seen by the output transistor. The output transistor includes a variable feedback capacitor. Together the feedback capacitor and predriver resistor form an RC time constant. The value of the RC time constant is adjusted by adjusting the capacitance of the feedback capacitor.

A testing system or device applies a tuning loop to test the oscillator circuit frequency response, 504. From the tuning test, the production RC time constant is determined, and an adjustment value can be determined, as necessary, to bring the RC time constant within a desired range. The testing system determines the adjustment value to bring the tested RC time constant of the oscillator circuit within tolerance, 506. As discussed above, when using an on-chip oscillator, an oscillator with equivalent resistors and capacitors as the digital driver circuit can be used to determine appropriate trim values for the digital driver circuit. Thus, the testing system stores the determined adjustment value to apply to the digital driver circuit in operation. The testing system stores the adjustment value to a storage associated with the digital driver circuit, or to an I/C of which the digital driver circuit is a part, 508. The stored values are applied to the digital driver circuit as a control signal to control the value of the variable capacitor.

In one embodiment, a trimmable variable capacitor is used in place of one that is controlled by a digital control signal. Thus, certain tap points can be switched on or off fused) to provide the desired capacitance. It will be understood that the determination of an adjustment value and storing the adjustment value can be understood as determining how to trim the capacitor, and then executing the trimming.

In one embodiment, rather than sending a specific value, the test system could simply provide an indication of the variance of the RC time constant from a desired time constant. A microprocessor or logic circuit could take the variance as an input and generate a control signal for the variable capacitor based on the variance. Thus, the test system may indicate an error rather than a correction code, and the correction code is generated on-chip.

Figure 6:
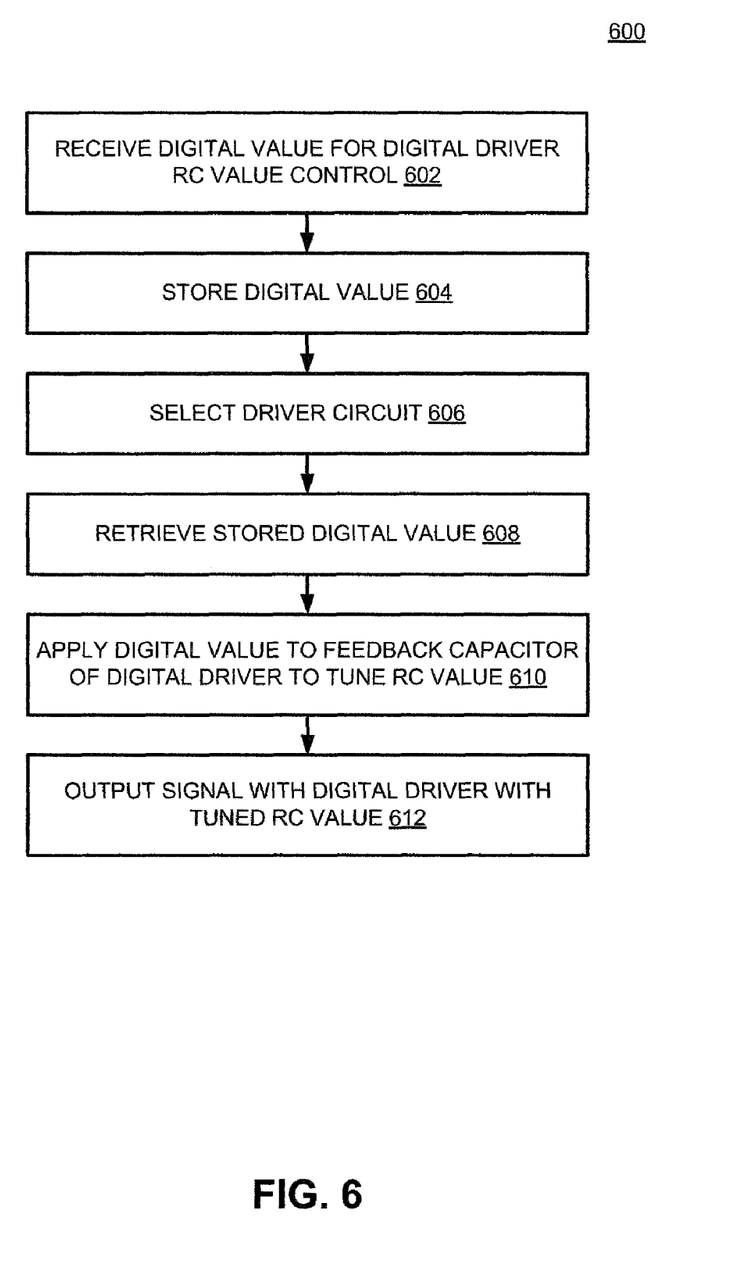
FIG. 6 is a flow diagram of a method embodiment for applying a digital value to tune an output RC time constant of a digital driver.

FIG. 6 is a flow diagram of a method embodiment for applying a digital value to tune an output RC time constant of a digital driver. In one embodiment, a testing loop is applied to a digital driver to determine a setting for a variable, selectable capacitance of a feedback capacitor to give the digital driver a desired frequency response. Alternatively, testing could be performed manually. However the digital value is determined, the value is input into the digital driver for application to the feedback capacitor. Thus, the digital driver receives the digital value to use for control of the RC time constant, or RC value, 602.

The digital value is stored in the digital driver, or in a storage device associated with the digital driver, 604. In one embodiment, different values are set for different drivers, although a simpler implementation would be to apply the same digital value to all digital drivers in an I/C, as mentioned previously. However, in the case that different values may be used, an IC may need to select the digital driver circuit to which the digital value should be applied, 606. The stored digital value is retrieved from storage by the IC to apply to the digital driver, 608.

The digital value is applied to the feedback capacitor or feedback capacitance portion of a feedback capacitor of the digital driver to tune the RC value of the digital driver to a desired value, 610. The digital driver can then be operated to output a signal with the digital driver with the tuned RC value, 612. The tuning of the RC value can control the output switching performance of the digital driver.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium or computer readable medium may cause a machine to perform the functions or operations described, and includes any mechanism that provides (i.e., stores and/or transmits) information in a form accessible by a machine (e.g., computing device, electronic system, or other device), such as via recordable/non-recordable media (e.g., read only memory (RUM), random access memory (RAM), magnetic disk storage media, optical storage media, flash memory devices, or other storage media) or via transmission media (e.g., optical, digital, electrical, acoustic signals or other propagated signal). A communication interface includes any mechanism that interfaces to any of a hardwired, wireless, optical, or other medium to communicate to another device, such as a memory bus interface, a processor bus interface, an Internet connection, a disk controller. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A digital driver, comprising:
   an output transistor having an output terminal to provide an output signal in response to an input signal, the output transistor having a control terminal to control state of the output transistor;
   a predriver circuit including a predriver transistor coupled to a resistor, where the resistor is further coupled to the control terminal of the output transistor; and
   a feedback capacitor with variable, selectable values coupled between the output terminal and the control terminal of the output transistor, where the feedback capacitor and the resistor form an RC time constant, wherein the selectable value is set by a digital number to tune the RC time constant to a value to control digital output switching, wherein the digital driver is configured to receive the digital number from a tuning circuit including a tuning oscillator, to tune the RC time constant to adjust for driver edge performance, including adjusting for manufacturing processing variations.

2. The digital driver of claim 1, wherein the output transistor comprises:
   a metal-oxide semiconductor (MOS) transistor where the control terminal includes a gate node of the MOS transistor, and where the output terminal includes a drain node of the MOS transistor.

3. The digital driver of claim 1, wherein the output transistor comprises:
   an n-type output transistor.

4. The digital driver of claim 3, wherein the output transistor further includes a reference terminal coupled to a reference voltage, wherein the reference voltage comprises:
   a reference low voltage for the digital driver.

5. The digital driver of claim 1, wherein the output transistor comprises:
   a p-type output transistor.

6. The digital driver of claim 5, wherein the output transistor further includes a reference terminal coupled to a reference voltage, wherein the reference voltage comprises:
   a reference high voltage for the digital driver.

7. The digital driver of claim 1, wherein the variable capacitance comprises:
   a digitally-controlled variable capacitor.

8. The digital driver of claim 1, wherein the variable capacitance value is determined based on an oscillator tuning loop test of the digital driver to achieve a desired frequency response of the output transistor.

9. The digital driver of claim 1, wherein the predriver transistor of the predriver circuit is a first predriver control transistor to control turn-on of the output transistor, and the predriver circuit includes a second predriver control transistor to control turn-off of the output transistor, the digital driver further comprising:
   inverter circuitry to delay the input signal to the first predriver control transistor with respect to the second predriver control transistor, to lengthen the turn-on response of the output transistor as compared to the turn-off response of the output transistor.

10. A method comprising:
    retrieving a digital value for tuning a variable feedback capacitor coupled between an output terminal and a control terminal of an output transistor of a digital driver;
    applying the digital value to the variable feedback capacitor to adjust an RC time constant formed by the variable feedback capacitor and a resistor of a predriver circuit that drives the output transistor,
       wherein the digital driver is configured to receive the digital value from a tuning circuit including a tuning oscillator, to tune the RC time constant to adjust for driver edge performance, including adjusting for manufacturing processing variations; and
    providing an output signal with the digital driver in response to an input signal, with a switching response of the digital driver controlled by the RC time constant.

11. The method of claim 10, wherein the output transistor comprises:
    a metal-oxide semiconductor (MOS) transistor where the control terminal includes a gate node of the MOS transistor, and where the output terminal includes a drain node of the MOS transistor.

12. The method of claim 10, further comprising:
delaying the input signal with inverter circuitry to delay the input signal to a first predriver control transistor with respect to a second predriver control transistor, to lengthen the turn-on response of the output transistor as compared to the turn-off response of the output transistor.

13. The method of claim 10, wherein applying the digital value comprises:
setting bits on the digital driver to control the value of the variable feedback capacitor.

14. The method of claim 10, wherein retrieving the digital value comprises:
receiving the digital value from a component on-chip with the output transistor that is to apply a result of an oscillator tuning loop to tune the RC time constant.

15. The method of claim 10, wherein further comprising:
setting bits in a fuse ROM (read only memory) on a digital driver control circuit to tune the value of the variable feedback capacitor.

16. A system comprising:
a digital driver including
complementary n-type and p-type output transistors to collectively drive an output line, each output transistor having an output terminal to provide an output signal in response to an input signal, each output transistor having a control terminal to control state of the output transistor;
a predriver circuit for each of the output transistors to drive the respective control terminal of each output transistor in response to the input signal, each predriver circuit including a predriver transistor coupled to a resistor, where the resistor is further coupled to the control terminal of a respective output transistor; and
a feedback CAPDAC for each output transistor, coupled between the output terminal and the control terminal of the respective output transistor, where each respective CAPDAC and resistor of each respective predriver circuit form an RC time constant, wherein each CAPDAC value is set with a digital value to tune the RC time constants to a value to control output switching;
an oscillator coupled to the digital driver in a control loop, the oscillator to provide a test frequency to test a response of the digital driver; and
a frequency detector coupled to the digital driver and the oscillator in the control loop, to determine an oscillator frequency that indicates a desired response for the digital driver, and provide the digital value to tune the RC time constants in accordance with the desired response.

17. The system of claim 16, the digital driver further comprising:
a fixed-capacitance feedback capacitor for the n-type output transistor, with a value to adjust a speed of falling edge transitions to be substantially similar to a speed of rising edge transitions.

18. The system of claim 16, the digital driver further comprising:
an output resistor in the output line to reduce reflections from output signal transitions.
a reference high voltage for the digital driver.

19. The system of claim 16, wherein each predriver circuit includes a first predriver control transistor to control turn-on of the output transistor, and a second predriver control transistor to control turn-off of the output transistor, the digital driver further comprising:
inverter circuitry to delay the input signal to the first predriver control transistor with respect to the second predriver control transistor, to lengthen the turn-on response of the output transistor as compared to the turn-off response of the output transistor.

20. The digital driver of claim 1, wherein the digital driver is configured to receive the digital number from a tuning circuit on-chip with the output transistor.

* * * * *